(12) United States Patent
Hsieh et al.

(10) Patent No.: US 8,361,684 B2
(45) Date of Patent: Jan. 29, 2013

(54) METHOD FOR PATTERNING TRENCHES WITH VARYING DIMENSION

(75) Inventors: Wen-Kuo Hsieh, Taipei (TW); Hsin-Yi Tsai, Hsinchu (TW); Min Cao, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 100 days.

(21) Appl. No.: 12/975,120

(22) Filed: Dec. 21, 2010

(65) Prior Publication Data
US 2012/0156593 A1 Jun. 21, 2012

(51) Int. Cl.
*G03F 9/00* (2006.01)
(52) U.S. Cl. .............. 430/30; 430/5; 430/22; 430/311; 430/312; 430/394
(58) Field of Classification Search ............. 430/5, 22, 430/30, 311, 312, 394
See application file for complete search history.

(56) References Cited

U.S. PATENT DOCUMENTS
6,830,852 B2 * 12/2004 Kawata et al. ................ 430/5

* cited by examiner

*Primary Examiner* — Christopher Young
(74) *Attorney, Agent, or Firm* — Haynes and Boone, LLP

(57) ABSTRACT

Methods for patterning integrated circuit (IC) features with varying dimensions are provided. In an example, a method includes forming a first patterned radiation-sensitive resist layer over a device substrate using a first mask, wherein the first patterned radiation-sensitive resist layer includes a first portion of an IC pattern; using the patterned first radiation-sensitive resist layer as a mask to form the first portion of the IC pattern in the device substrate; forming a second patterned radiation-sensitive resist layer over the device substrate using a second mask, wherein the second patterned radiation-sensitive resist layer includes a second portion of the IC pattern; and using the patterned second radiation-sensitive resist layer as a mask to form the second portion of the IC pattern in the device substrate. The combined first and second portions of the IC pattern in the device substrate form an IC feature having a dimension greater than dimensions of the first and second portions.

20 Claims, 10 Drawing Sheets

METHOD FOR PATTERNING TRENCHES WITH VARYING DIMENSION

BACKGROUND

Integrated circuit (IC) technologies are constantly being improved. Such improvements frequently involve scaling down device geometries to achieve lower fabrication costs, higher device integration density, higher speeds, and better performance. Photolithography is frequently used for forming components of an integrated circuit device. Generally, an exposure tool passes light through a photomask or reticle and focuses the light onto a photosensitive layer of a wafer, resulting in the photosensitive layer having an image of IC features therein. The photosensitive layer is then developed, such that a patterned photosensitive layer is formed that includes a pattern of the IC features. This pattern may then be transferred to the wafer, such that the IC features may be formed in the wafer. It has been observed that printing IC features having varying dimensions is presently limited by lithography material properties and/or lithography process characteristics. Accordingly, although existing approaches for patterning IC features have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
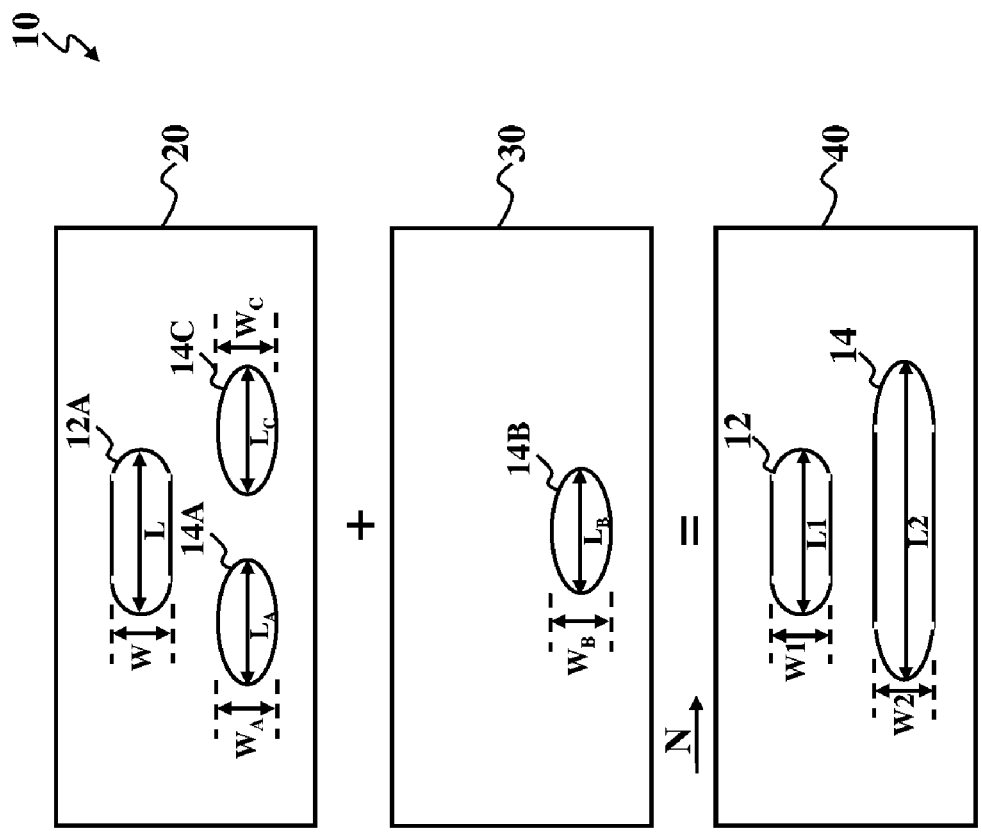
FIG. 1 is a top view of an integrated circuit (IC) pattern constructed according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, descriptions of a first feature "on" or "over" a second feature (and like descriptions) may include embodiments where the first and second features are in direct contact, and may also include embodiments where additional features are interposed between the first and second features.

In addition, the present disclosure may repeat reference numerals and/or letters in the various examples. This repetition is for the purpose of simplicity and clarity and does not in itself dictate a relationship between the various embodiments and/or configurations discussed.

FIG. 1 is a top view of an integrated circuit (IC) pattern 10 constructed according to various aspects of the present disclosure. The IC pattern 10 is separated onto more than one mask (also referred to as a photomask or reticle), which is used to fabricate IC features on one or more device substrates (wafers) during a lithography patterning process. In the depicted embodiment, the IC pattern 10 includes portions 12A, 14A, 14B, and 14C that are separated onto masks 20 and 30. More specifically, portions 12A, 14A, and 14C are formed on mask 20, and portion 14B is formed on mask 30. The masks 20 and 30 are any suitable type mask. For example, masks 20 and 30 may each be a transparent substrate, such as a fused quartz substrate, in which portions 12A, 14A, 14B, and 14C are respectively formed thereon. The portions 12A, 14A, 14B, and 14C of the IC pattern 10 may be fabricated on the masks 20 and 30 using a suitable mask making technology, such as binary technology, phase-shift mask (PSM) technology, or other suitable mask making technology.

In the depicted embodiment, the portions 14A and 14C are configured collinearly on mask 20, such that a center of the portions 14A and 14C aligns. The portion 14B is positioned on the mask 30, such that if masks 20 and 30 are placed one over the other, the portion 14B lies between portions 14A and 14C, collinearly aligns with portions 14A and 14C, and overlaps at least partially each portion 14A and 14C. Further, the portions 12A, 14A, 14B, and 14C have varying dimensions. Portion 12A has a width, W, and a length, L; portion 14A has a width, $W_A$, and a length, $L_A$; portion 14B has a width, $W_B$, and a length, $L_B$; portion 14C has a width, $W_C$, and a length, $L_C$. In the depicted embodiment, portions 14A, 14B, and 14C have substantially the same dimensions. In other words, $W_A \approx W_B \approx W_C$ and $L_A \approx L_B \approx L_C$. Each of the portions 14A, 14B, and 14C are elliptically-shaped in the depicted embodiment. Alternatively, the portions 14A, 14B, and 14C are otherwise shaped, such as rectangular shaped, triangularly shaped, spherically-shaped, or other suitable shape. The portions 14A, 14B, and 14C may be referred to as rectangular vias.

Each of the portions 12A, 14A, 14B, and 14C has a length to width ratio (length/width) that satisfies a lithography window for a lithography process, which in the depicted embodiment, is defined as a minimum length to width ratio (length/width) that is printable to a radiation-sensitive layer during a lithography patterning process (a process that transfers the portions 12A, 14A, 14B, and 14C of the IC pattern 10 from the masks 20 and 30 to device substrates (for example, semiconductor wafers)). Accordingly, L/W of portion 12A, $L_A/W_A$ of portion 14A, $L_B/W_B$ of portion 14B, and $L_C/W_C$ of portion 14C each satisfy the lithography processing window.

The portions 12A, 14A, 14B, and 14C correspond with IC features of the IC pattern 10 to be formed on device substrates during lithography possessing, such as metal lines, polysilicon gates, or other suitable IC features. The portion 12A corresponds to an IC feature 12 formed in a device substrate 40, and the portions 14A, 14B, and 14C correspond to an IC feature 14 formed in the device substrate 40. In the depicted embodiment, the top view of the IC pattern 10 shows that IC features 12 and 14 are patterned in a dielectric layer of the device substrate 40 by a lithography process using the masks 20 and 30. More specifically, in the depicted embodiment, the portions 12A, 14A, 14B, and 14C correspond to trenches to be formed in device substrates.

IC features 12 and 14 have different dimensions. For example, IC feature 12 has a length, L1, and a width, W1; and IC feature 14 has a length, L2, and a width W2. As illustrated in FIG. 1, L2 is greater than L1 (L2>L1), and the IC features 12 and 14 have substantially the same width (W1≈W2). IC feature 12's length and width is substantially the same as portion 12A's length and width on mask 20 (in other words, L1≈L and W1≈W). In contrast, IC feature 14's length is equivalent to about a combined length of the portions 14A, 14B, and 14C on masks 20 and 30 (in other words, L2≈$L_A$+$L_B$+$L_C$). As noted above, in the depicted embodiment, the portion 14B overlaps portions 14A and 14C, and thus, IC feature 14's length is less than the combined length of the portions 14A, 14B, 14C (in other words, L2<$L_A$+$L_B$+$L_C$). Similar to IC feature 12, IC feature 14's width is substantially the same as the widths of portions 14A, 14B, and 14C (in other words, W2≈$W_A$≈$W_B$≈$W_C$).

Typically, IC feature 14 is formed on mask 20 (for example, a pattern including portions 14A, 14B, and 14C combined onto one mask), such that a single mask can be used to simultaneously pattern IC features 12 and 14. It has been observed that properties of radiation-sensitive layers and lithography process characteristics limit the ability to simultaneously form IC features (such as trenches) having various dimensions. To address such concerns, the depicted embodiment separates an IC feature of the IC pattern 10 onto more than one mask when the IC feature has a dimension that falls outside material and processing capabilities (in other words, falls outside a process compatible lithography window, such as the length to width ratio noted above). For example, in the depicted embodiment, the length to width ratio of the IC feature 14 is outside the process compatible lithography window. More specifically, the L2/W2 ratio is greater than a printable length/width ratio, defined as a minimum length/width ratio printable to a radiation-sensitive layer during a lithography patterning process, which transfers the IC pattern from the mask to the semiconductor wafers. Thus, the pattern of the IC feature 14 is separated into more than one contiguous feature portion (portions 14A, 14B, and 14C) of approximately the same dimensions, where each feature portion has dimensions that satisfy the lithography window (or alternatively state, the pattern of the IC features 14 is separated into more than one rectangular via having the same dimensions, where the dimension of each rectangular via satisfies material lithography processing limitations). Alternatively, the portions 14A, 14B, and 14C may have varying dimensions, so long as the dimensions of each portion 14A, 14B, and 14C satisfies the lithography processing limitations.

Figure 2:
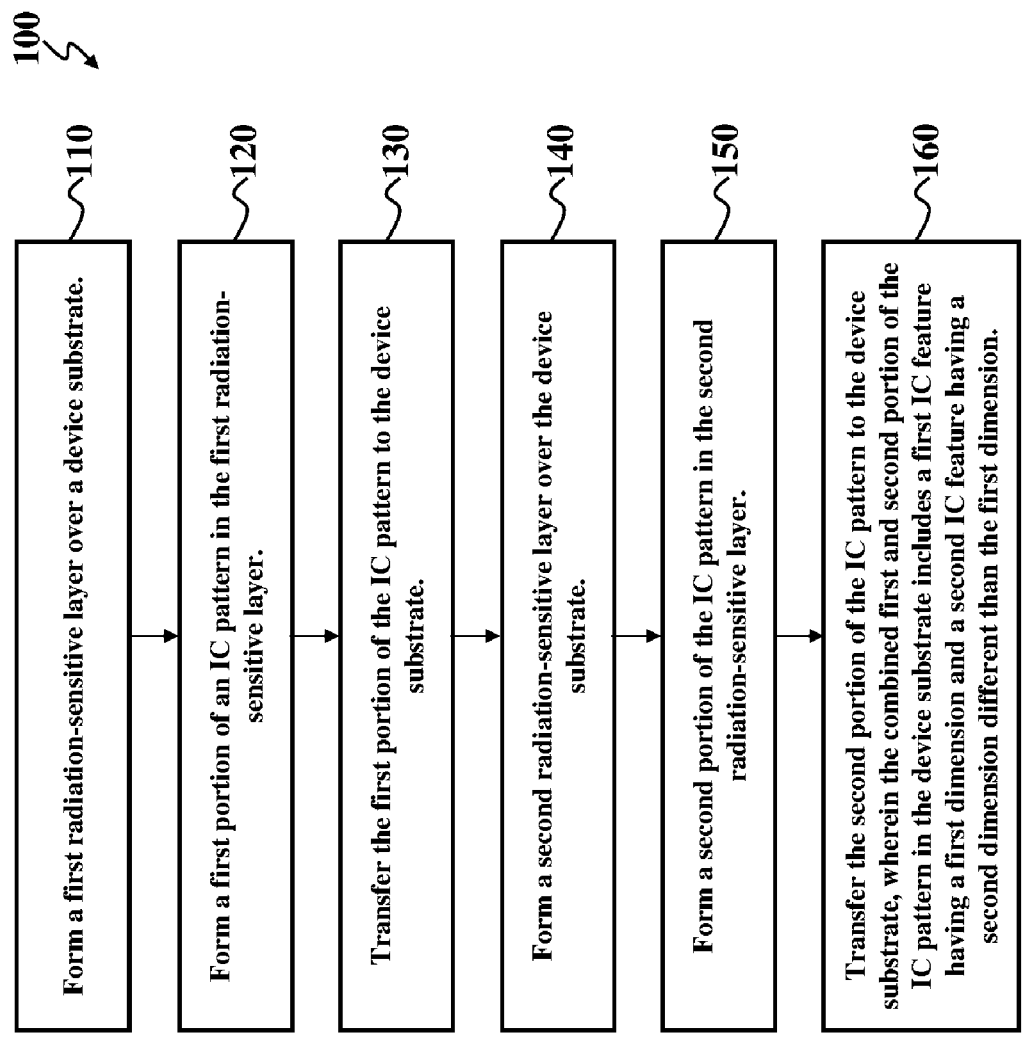
FIG. 2 is a flowchart of a method for patterning a device substrate using an IC pattern having IC features of varying dimensions according to various aspects of the present disclosure.

FIG. 2 is a flowchart of a method 100 for patterning a device substrate using an IC pattern having IC features of varying dimensions according to various aspects of the present disclosure. More specifically, in the depicted embodiment, the method 100 provides for patterning a device substrate using an IC pattern having trenches of varying dimensions. The method 100 begins at block 110 by forming a first radiation-sensitive layer over a device substrate. At block 120, a first portion of an IC pattern is formed in the first radiation-sensitive layer. For example, the first radiation-sensitive layer is exposed using radiation energy projected to the device substrate through a mask having a pattern that includes the first portion of the IC pattern, thereby forming an image of the first portion of the IC pattern on the first radiation-sensitive layer. The first-radiation sensitive layer is then developed to form a patterned first radiation-sensitive layer that includes the first portion of the IC pattern. A post-exposure baking process may be implemented before developing the first radiation-sensitive layer. At block 130, the first portion of the IC pattern is transferred to the device substrate. For example, the patterned first radiation-sensitive layer includes openings therein that expose the device substrate. The patterned first radiation-sensitive layer may act as a mask for an etching process. For example, portions of the exposed device substrate may be removed by an etching process to form a patterned device substrate that includes the first portion of the IC pattern. More specifically, the patterned device substrate may include one or more trenches (IC features) that form the first portion of the IC pattern.

At blocks 140 and 150, a second radiation-sensitive layer is formed over the device substrate, and a second portion of the IC pattern is formed in the second radiation-sensitive layer. More specifically, the second radiation-sensitive layer is formed over the patterned device substrate that includes the first portion of the IC pattern. The second radiation-sensitive layer may fill the one or more trenches of the patterned device substrate. The second radiation-sensitive layer may be patterned in a manner similar to the first radiation-sensitive layer. For example, the second radiation-sensitive layer is exposed using radiation energy projected to the device substrate through a mask having a pattern that includes the second portion of the IC pattern, thereby forming an image of the second portion of the IC pattern on the second radiation-sensitive layer. The second-radiation sensitive layer is then developed to form a patterned second radiation-sensitive layer that includes the second portion of the IC pattern. A post-exposure baking process may be implemented before developing the second radiation-sensitive layer.

At block 160, the second portion of the IC pattern is transferred to the device substrate. For example, the patterned second radiation-sensitive layer includes openings therein that expose the device substrate. The patterned second radiation-sensitive layer may act as a mask for an etching process. For example, portions of the exposed device substrate may be removed by an etching process to further pattern the device substrate, such that the patterned device substrate includes the second portion of the IC pattern. More specifically, the patterned device substrate may include one or more trenches (IC features) that form the second portion of the IC pattern. The combined first and second portions of the IC pattern in the device substrate form a first IC feature having a first dimension and a second IC feature having a second dimension that is different than the first dimension. For example, the first IC feature is a first trench having a first length and a first width, and the second IC feature is a second trench having a second length and a second width, where the second length is longer than the first length. In an example, the first IC feature is formed by the first portion of the IC pattern, and the second IC feature is formed by the combined first and second portions of the IC pattern. Accordingly, it the first IC feature had dimensions that satisfied material and lithography processing limitations, whereas the second IC feature did not have dimensions that satisfy material and lithography processing limitations (and thus, the pattern to form the second IC features was partitioned onto more than one mask).

In an example, the method 100 includes two exposure steps, utilizing the first radiation-sensitive resist layer in one exposure and the second radiation-sensitive resist layer in another exposure step, and two etching steps, thereby forming the first and second portions of the IC pattern in the device substrate. The method 100 may thus be referred to as a double patterning double etching (2P2E) process. In contrast to conventional 2P2E processing, the method 100 may implement 2P2E to form larger features, such as longer trenches (from the combined first and second portions of the IC pattern), as opposed to smaller features. In an example, the masks 20 and 30 described with reference to FIG. 1 may be used to pattern the first and second radiation-sensitive layers. Additional steps can be provided before, during, and after the method 100, and some of the steps described can be replaced or eliminated for other embodiments of the method. The discussion that follows illustrates various embodiments of a device substrate that can be fabricated according to the method 100 of FIG. 2.

FIGS. 3-7 are various diagrammatic cross-sectional views of an embodiment of an integrated circuit device 200 during various fabrication stages according to the method 100 of FIG. 2. FIGS. 3-7 have been simplified for the sake of clarity to better understand the inventive concepts of the present disclosure. In the depicted embodiment, as will be further discussed below, the integrated circuit device 200 includes trenches of varying lengths. Additional features can be added in the integrated circuit device 200, and some of the features described below can be replaced or eliminated in other embodiments of the integrated circuit device 200.

Figure 3:
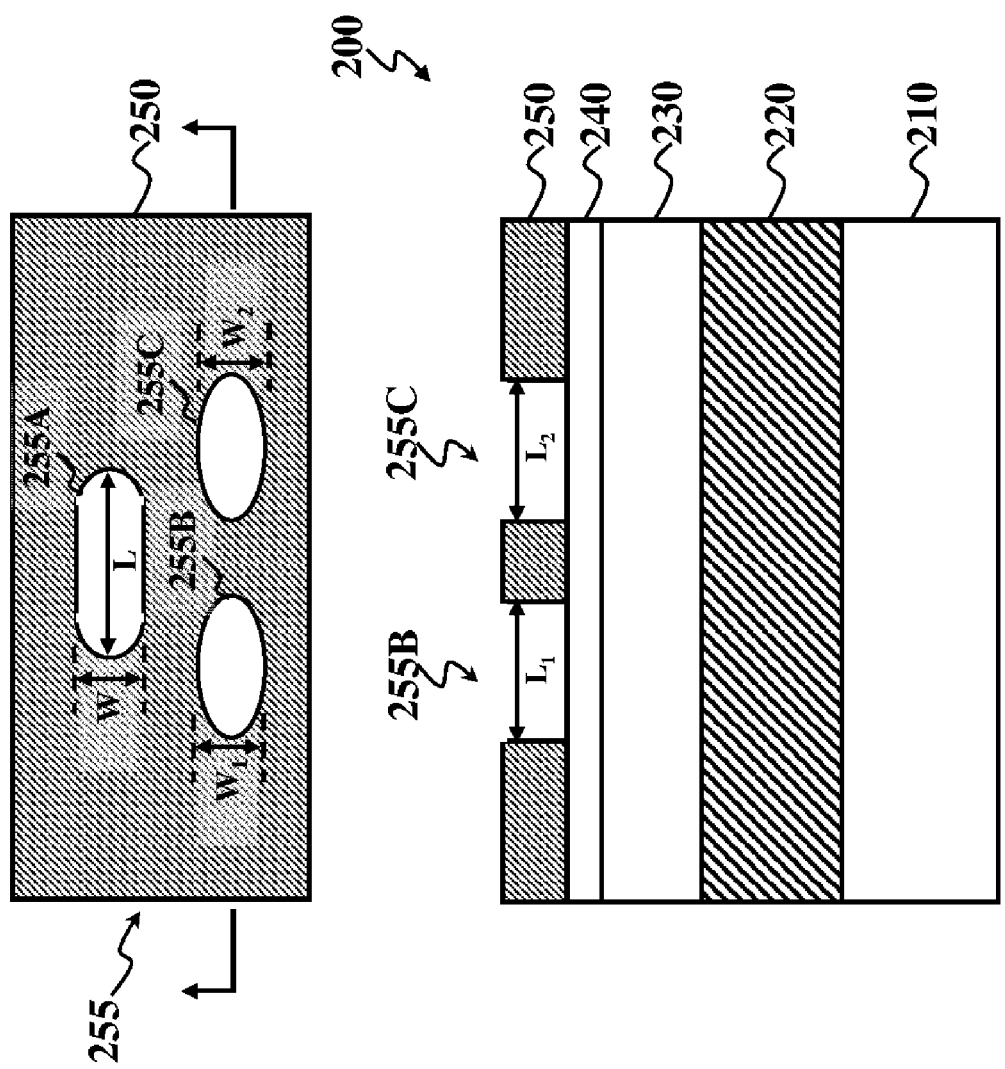
FIGS. 3-7 are various diagrammatic cross-sectional views of an embodiment of an integrated circuit device 200 during various fabrication stages according to the method of FIG. 2.

In FIG. 3, the integrated circuit device 200 includes a device substrate 210, such as a semiconductor substrate. In the depicted embodiment, the device substrate 210 is a silicon substrate (alternatively referred to as a silicon wafer). Alternatively or additionally, the device substrate 210 includes another elementary semiconductor, such as germanium or diamond; a compound semiconductor including silicon carbide, gallium arsenic, gallium phosphide, indium phosphide, indium arsenide, and/or indium antimonide; an alloy semiconductor including SiGe, GaAs, GaAsP, AlInAs, AlGaAs, GaInAs, GaInP, and/or GaInAsP; or combinations thereof. The device substrate 210 may alternatively be a non-semiconductor material, such as a glass substrate for thin-film-transistor liquid crystal display (TFT-LCD) device. The device substrate 210 may include various doped regions, insulating features, conductive features, semiconductor features, or combinations thereof depending on design requirements.

The device substrate 210 includes a material layer 220 to be patterned by subsequent processing. The material layer 220 may be a polysilicon layer, a conductive layer, a dielectric layer, or multiple layers of various materials. In the depicted embodiment, the material layer 220 includes a dielectric material, such as a dielectric material, such as silicon oxide, silicon nitride, silicon oxynitride, spin-on glass, fluoride-doped silicate glass, carbon doped silicon oxide, Black Diamond® (Applied Materials of Santa Clara, Calif.), Xerogel, Aerogel, amorphous fluorinated carbon, parylene, BCB (bis-benzocyclobutenes), SiLK (Dow Chemical, Midland, Mich.), polyimide, other dielectric material, or combinations thereof. In the depicted embodiment, the device substrate 210 also includes an etch stop layer (not shown) disposed between the material layer 220 and other layers or materials of the device substrate 210. The etch stop layer may be a carbide layer. The material of the etch stop layer is selected such that an etching process selectively etches the material layer 220 without affecting the etch stop layer or underlying layers or materials of the device substrate 210. It is understood that the etch stop layer may be omitted.

An imaging layer is disposed over the material layer 220 of the device substrate 210. The imaging layer can be a radiation-sensitive resist layer (also referred to as a photoresist layer, photosensitive layer, patterning layer, light sensitive layer, etc.) that is responsive to an exposure process for creating patterns. The imaging layer may be a positive-type or negative-type resist material and may have a multi-layer structure. In the depicted embodiment, a tri-layer resist patterning scheme is utilized. Thus, the imaging layer includes three imaging layers—a bottom layer 230, a middle layer 240, and a top layer 250. More particularly, the bottom layer 230 is disposed over the material layer 220 of the device substrate 210, the middle layer 240 is disposed over the bottom layer 230, and the top layer 250 is disposed over the middle layer 240. Alternatively, the top layer 250 may be disposed directly on the material layer 220 of the device substrate 210, without the intervening bottom layer 230 and middle layer 240.

The bottom and middle layers 230, 240 comprise any suitable material and are formed by any suitable process. For example, the layers 230 and 240 may include various organic and/or inorganic materials. In one example, bottom layer 230 is an organic layer, and the middle layer 240 is an inorganic layer. The bottom organic layer may comprise a photoresist material, an anti-reflective coating (ARC) material, a polymer material, and/or other suitable materials. The middle inorganic layer may comprise an oxide layer, such as a low temperature CVD oxide, an oxide derived from TEOS (tetraethylorthosilicate), silicon oxide, or silane oxide. Another example includes the middle layer as a Si-containing anti-reflective coating (ARC) material, such as a 42% Si-containing ARC layer. The resist layer is formed on the device substrate by a suitable technology, such as spin-on coating.

The top layer 250 is a patterned top layer. More specifically, the patterned top layer 250 is a radiation-sensitive resist layer, such as a photoresist layer, disposed over the material layer 220 of the device substrate 210. The top layer 250 can be a positive-type or a negative-type resist. For advanced patterning, such as that using an extreme ultraviolet (EUV) radiation beam, the top layer 250 may be a chemical amplification (CA) photoresist.

The patterned top layer 250 includes a first portion of an IC pattern. More specifically, the patterned top layer 250 includes openings 255 therein. The openings 255 form the first portion of the IC pattern. In the depicted embodiment, the first portion of the IC pattern includes pattern portions 255A, 255B, and 255C, which are trenches (openings or recesses) in the patterned top layer 250. The pattern portions 255B and 255C are collinearly aligned, specifically a center of portions 255B and 255C are collinearly aligned and spaced a distance from one another. In other words, a portion of the top layer 250 separates pattern portion 255B from pattern portion 255C. Similarly, a portion of the top layer 250 separates pattern portion 255A from pattern portions 255B and 255C. Each of the pattern portions 255A, 255B, and 255C are elliptically-shaped in the depicted embodiment. Alternatively, the pattern portions 255A, 255B, and 255C are otherwise shaped, such as rectangular shaped, triangularly shaped, spherically-shaped, or other suitable shape. The portions 255A, 255B, and 255C may be referred to as rectangular vias.

The pattern portions 255A, 255B, and 255C have varying dimensions. The pattern portion 255A has a width, W, and a length, L; the pattern portion 255B has width, $W_1$, and a length $L_1$; and the pattern portion 255C has a width, $W_2$, and a length, $L_2$. In the depicted embodiment, pattern portions 255B and 255C have substantially the same dimensions. In other words, $W_1 \approx W_2$ and $L_1 \approx L_2$. Each of the pattern portions 255A, 255B, and 255C has a length to width ratio (length/width) that satisfies a lithography window for a lithography process, which in the depicted embodiment, is defined as a minimum length to width ratio (length/width) that is printable to a radiation-sensitive layer during a lithography patterning process. Accordingly, L/W of pattern portion 255A, $L_1/W_1$ of pattern portion 255B, and $L_2/W_2$ of pattern portion 255C each satisfy the lithography processing window. More specifically, each of the pattern portions 255A, 255B, and 255C have a length that meets a threshold lithography process parameter, such as a threshold length. Alternatively, the pattern portions 255A, 255B, and 255C may have different dimensions, so long as the dimensions of the pattern portions 255A, 255B, and 255C satisfy the lithography threshold process parameters.

The top layer 250 is formed over the device substrate 210 by a suitable technology, such as spin-on coating. The coated resist layer may be baked in a subsequent processing step, such as soft baking. The top layer 250 may be patterned by providing a mask defining the first portion of the IC pattern. More specifically, the mask used to pattern the top layer 250 has a pattern including the first portion of the IC pattern. The mask thus includes pattern features that correspond with the pattern portions 255A, 255B, and 255C formed in the top layer 250. In an example, the mask includes a transparent substrate (or photomask substrate), such as a fused quartz substrate. In another example, the first portion of the IC pattern is formed on the mask using binary technology or phase-shift mask (PSM) technology. The top layer 250 may be exposed utilizing the mask in a lithography tool, such as a scanner or stepper. For example, the exposing process may include exposing the top layer 250 with a radiation beam through the mask defining the first portion of the IC pattern. The radiation beam may be ultraviolet (UV) or extreme ultraviolet (EUV), such as a 248 nm beam from a krypton fluoride (KrF) excimer laser or a 193 nm beam from an argon fluoride (ArF) excimer laser. In an example, the top layer 250 resist layer includes photo-acid generator (PAG) that generates acid during the exposing process. The exposed top layer 250 may be treated by a baking process, such as a post exposure baking (PEB). During the PEB process, the top layer 250 may be at a higher temperature, and thus, when top layer 250 includes PAG, more acids may be generated from the PAGs through a chemical amplification process. A developing process is performed on the top layer 250, forming the patterned top layer 250 (in other words, forming the pattern portions 255A, 255B, and 255C in the top layer 250). During the developing process, a developing solution is applied to the top layer 250. In an example, the top layer 250 within the exposed regions is removed during the developing process. The developing solution is a basic solution, such as tetramethyl ammonium hydroxide (TMAH).

Figure 4:
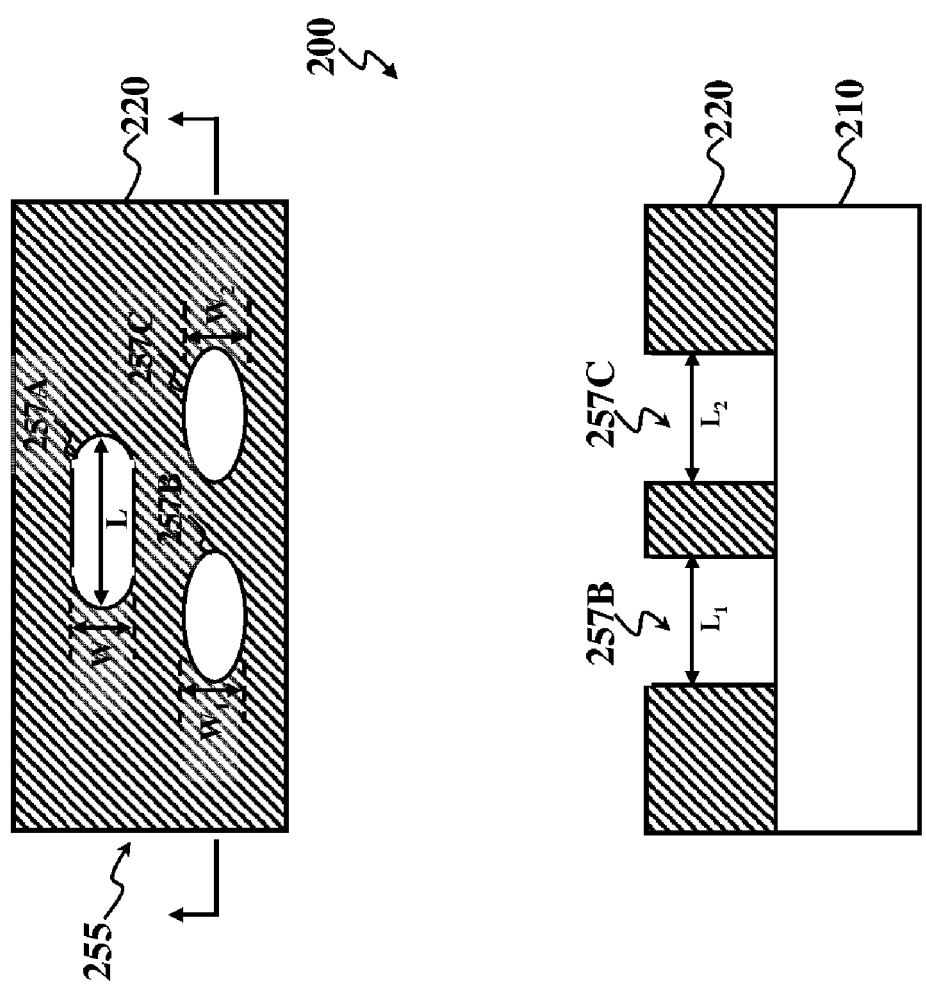

In FIG. 4, the first portion of the IC pattern has been transferred to the device substrate 210, more specifically, the material layer 220 of the device substrate 210. Thus, the material layer 220 includes pattern portions 257A, 257B, and 257C, which are trenches (openings or recesses) in the material layer 220. The pattern portions 257A, 257B, and 257C are similar to the pattern portions 255A, 255B, and 255C of the patterned top layer 250. For example, the pattern portions 257B and 257C are collinearly aligned, specifically a center of portions 257B and 257C are collinearly aligned and spaced a distance from one another. In other words, a portion of the material layer 220 separates pattern portion 257B from pattern portion 257C. Similarly, a portion of the material layer 220 separates pattern portion 257A from pattern portions 257B and 257C. Each of the pattern portions 257A, 257B, and 257C are elliptically-shaped in the depicted embodiment. Alternatively, the pattern portions 257A, 257B, and 257C are otherwise shaped, such as rectangular shaped, triangularly shaped, spherically-shaped, or other suitable shape. The pattern portions 257A, 257B, and 257C may be referred to as rectangular vias. Further, the pattern portions 257A, 257B, and 257C have dimensions similar to the pattern portions 255A, 255B, and 255C.

In the depicted embodiment, the patterned top layer 250 is used as a mask to form the first portion of the IC pattern in the material layer 220. For example, an etching process is applied to the integrated circuit device 200 using the patterned top layer 250 as an etch mask. The pattern defined in the patterned top layer (in other words, the first portion of the IC pattern) is transferred to the material layer 220 by the etching process. More particularly, the material layer 220 of the device substrate 210 is etched through the openings (pattern portions) 255A, 255B, and 255C of the patterned top layer 250. In the depicted embodiment, the etching process removes portions of the middle layer 240, bottom layer 230, and material layer 220 within the openings, thereby forming pattern portions 257A, 257B, and 257C in the material layer 220. The etching process may be a dry etching process, a wet etching process, or combination thereof. The material disposed underneath the material layer 220 may selected, and/or the etching recipe of the etching process may be tuned, such that the etching process stops at the device substrate 210. Thereafter, the patterned top layer 250 (and middle layer 240 and bottom layer 230) are removed by a suitable process, such as a wet stripping process or plasma ashing process, as illustrated in FIG. 4.

Figure 5:
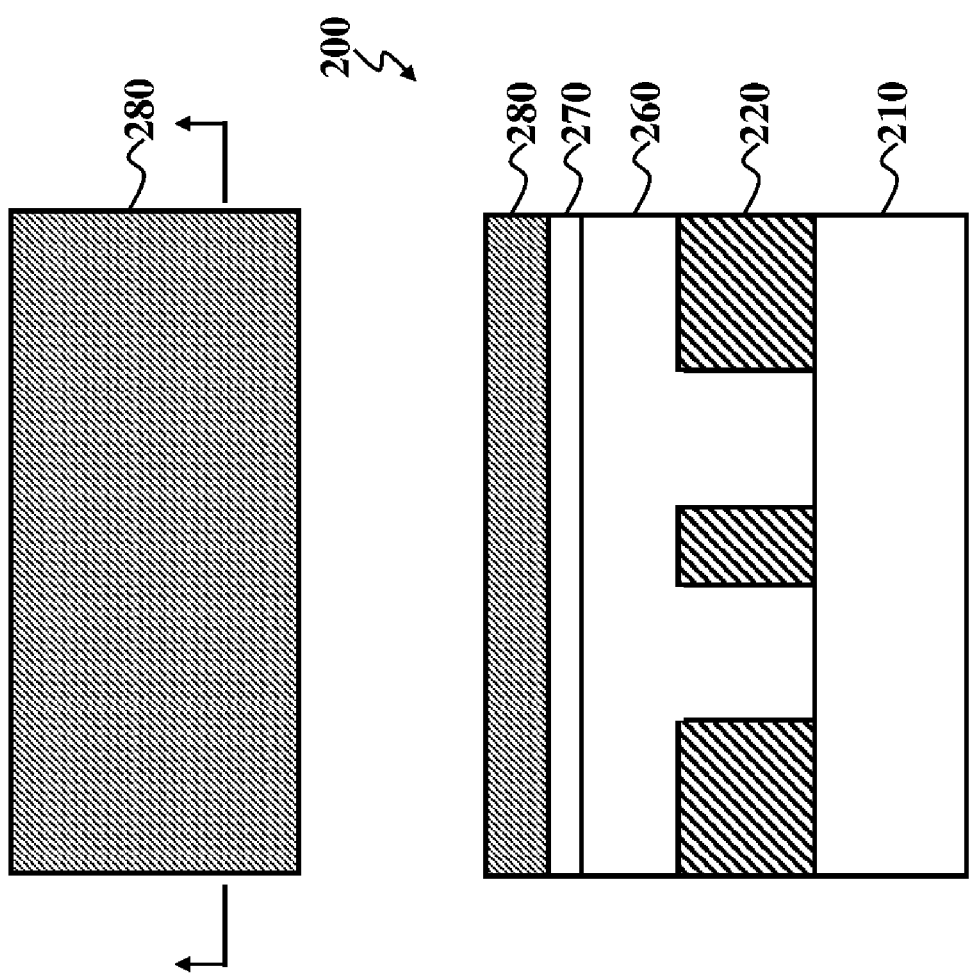

In FIG. 5, another imaging layer is disposed over the material layer 220 of the device substrate 210. The imaging layer can be a radiation-sensitive resist layer (also referred to as a photoresist layer, photosensitive layer, patterning layer, light sensitive layer, etc.) that is responsive to an exposure process for creating patterns. The imaging layer may be a positive-type or negative-type resist material and may have a multi-layer structure. In the depicted embodiment, a tri-layer resist patterning scheme is utilized. Thus, the imaging layer includes three imaging layers—a bottom layer 260, a middle layer 270, and a top layer 280. More particularly, the bottom layer 260 is disposed over the material layer 220 of the device substrate 210 (the bottom layer 260 fills the openings (pattern portions) 257A, 257B, and 257C), the middle layer 270 is disposed over the bottom layer 260, and the top layer 280 is disposed over the middle layer 280. Alternatively, the top layer 280 may be disposed directly on the material layer 220 of the device substrate 210 (also filling the openings (pattern portions 257A, 257B, and 257C), without the intervening bottom layer 260 and middle layer 280. The bottom layer 260 and middle layer 270 are similar to the bottom layer 230 and middle layer 240, respectively, and are formed by a similar process as bottom and middle layers 230, 240.

Figure 6:
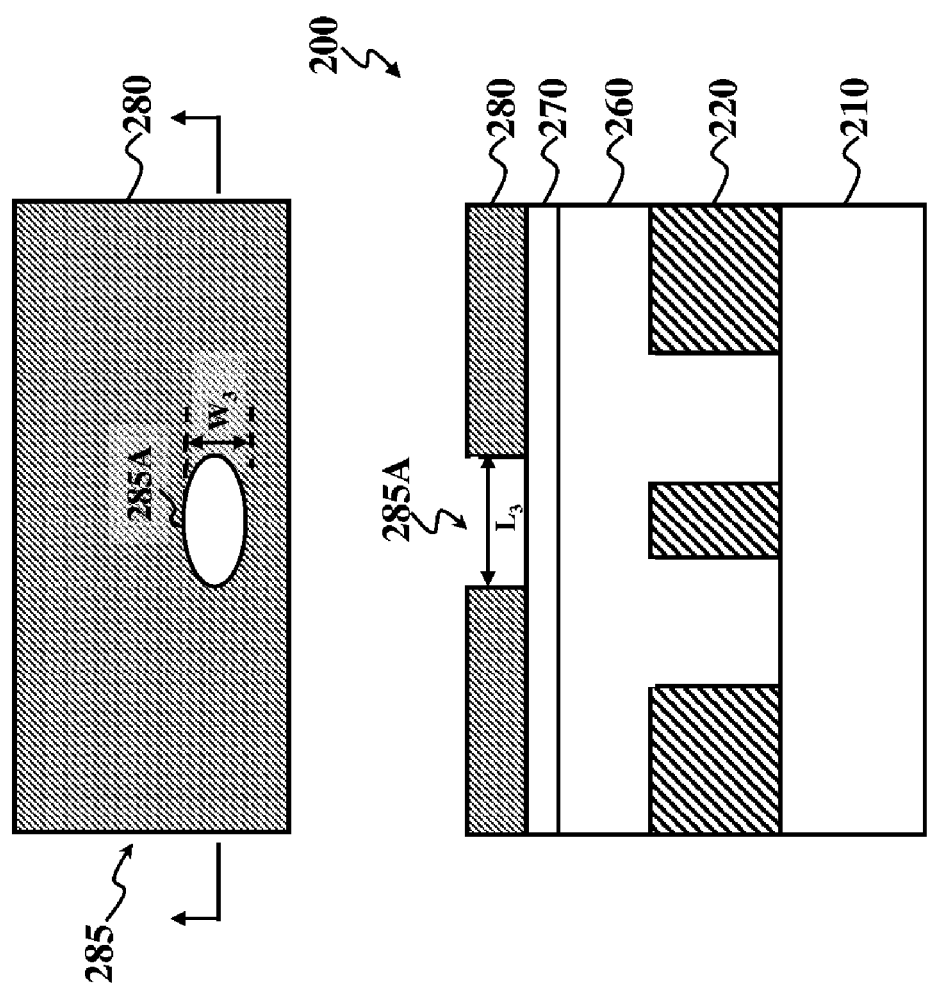

The top layer 280 is similar to the top layer 250, and formed by a process similar to top layer 250. For example, the top layer 280 is a radiation-sensitive resist layer, such as a photoresist layer, disposed over the material layer 220 of the device substrate 210. The top layer 280 can be a positive-type or a negative-type resist. For advanced patterning, such as that using an extreme ultraviolet (EUV) radiation beam, the top layer 280 may be a chemical amplification (CA) photoresist. In FIG. 6, the top layer 280 is patterned, and is thus referred to as patterned top layer 280. The patterned top layer 280 includes a second portion of an IC pattern. More specifically, the patterned top layer 280 includes openings 285 therein. The openings 285 form the second portion of the IC pattern. In the depicted embodiment, the second portion of the IC pattern includes pattern portion 285A, which is a trench (opening or recess) in the patterned top layer 280. The pattern portion 285A overlies a portion of the material layer 220 that separates the pattern portions 257B and 257C. The pattern portion 285A is elliptically-shaped in the depicted embodiment. Alternatively, the pattern portion 285A is otherwise shaped, such as rectangular shaped, triangularly shaped, spherically-shaped, or other suitable shape. The pattern portion 285A may be referred to as a rectangular via. In the depicted embodiment, the pattern portion 285A has a width, $W_3$, and a length, $L_3$. In the depicted embodiment, pattern portion 285A has substantially the same dimensions as pattern portions 255B and 255C (and corresponding portions 257A and 257C). In other words, $W_1 \approx W_2 \approx W_3$ and $L_1 \approx L_2 \approx L_3$. The pattern portion 285A has a length to width ratio (length/width) that satisfies a lithography window for a lithography process, which in the depicted embodiment, is defined as a minimum length to width ratio (length/width) that is printable to a radiation-sensitive layer during a lithography patterning process. Accordingly, $L_3/W_3$ of pattern portion 285A satisfies the lithography processing window. More specifically, pattern portion 285A has a length that meets a threshold lithography process parameter, such as a threshold length. Alternatively, the pattern portion 285A may have different dimensions than the pattern portions 255B and 255C (and corresponding portions 257A and 257B), so long as the dimensions of the pattern portion 285A satisfy the lithography threshold process parameters.

The top layer 280 may be patterned by providing a mask defining the second portion of the IC pattern. More specifically, the mask used to pattern the top layer 280 has a pattern including the second portion of the IC pattern. The mask thus includes pattern features that correspond with the pattern portion 285A formed in the top layer 280. In an example, the mask includes a transparent substrate (or photomask substrate), such as a fused quartz substrate. In another example, the first portion of the IC pattern is formed on the mask using binary technology or phase-shift mask (PSM) technology. The top layer 280 may be exposed utilizing the mask in a lithography tool, such as a scanner or stepper. For example, the exposing process may include exposing the top layer 280 with a radiation beam through the mask defining the first portion of the IC pattern. The radiation beam may be ultraviolet (UV) or extreme ultraviolet (EUV), such as a 248 nm beam from a krypton fluoride (KrF) excimer laser or a 193 nm beam from an argon fluoride (ArF) excimer laser. In an example, the top layer 280 resist layer includes photo-acid generator (PAG) that generates acid during the exposing process. The exposed top layer 280 may be treated by a baking process, such as a post exposure baking (PEB). During the PEB process, the top layer 280 may be at a higher temperature, and thus, when top layer 280 includes PAG, more acids may be generated from the PAGs through a chemical amplification process. A developing process is performed on the top layer 280, forming the patterned top layer 280 (in other words, forming the pattern portion 285A in the top layer 280). During the developing process, a developing solution is applied to the top layer 280. In an example, the top layer 280 within the exposed regions is removed during the developing process. The developing solution is a basic solution, such as tetramethyl ammonium hydroxide (TMAH).

Figure 7:
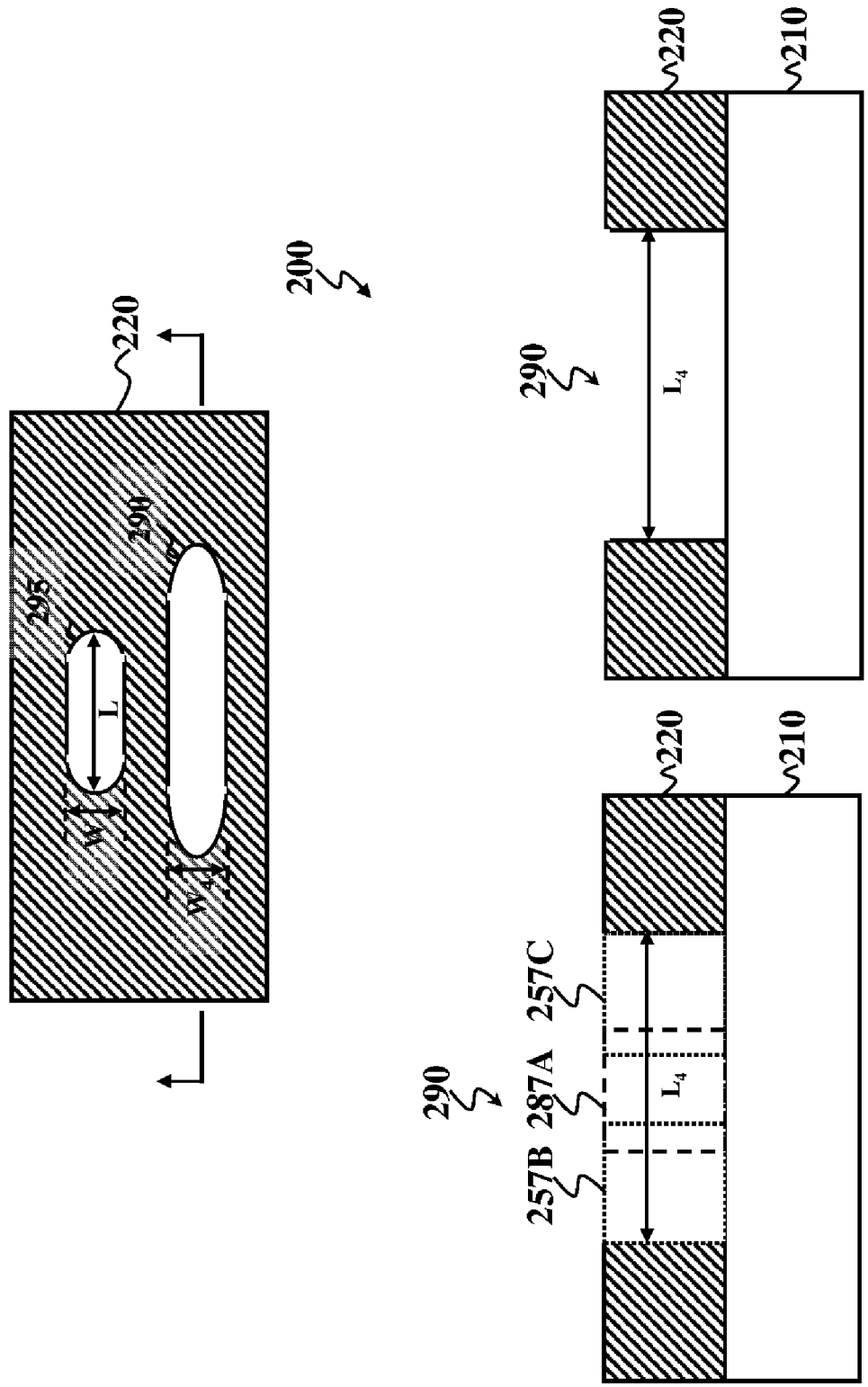

In FIG. 7, the second portion of the IC pattern has been transferred to the device substrate 210, more specifically, the material layer 220 of the device substrate 210. Thus, the material layer 220 includes pattern portion 287A, which is a trench (opening or recess) in the material layer 220. The pattern portion 287A is similar to the pattern portion 285A. When the pattern portion 285A is transferred to the material layer 220, thereby forming pattern portion 287A in the material layer 220, the pattern portions 257B, 257C and 287A merge together to form an IC feature 290 in the material layer 220. More specifically, the pattern portions 257B, 287A, and 257C are collinearly aligned (specifically a center of portions 257B, 287A, and 257C), and each of the pattern portions 257B, 287A, and 257C partially overlaps at least one of the pattern portions 257B, 287A, and 257C to merge together to form the IC feature 290. The material layer 220 also includes an IC feature 295, which corresponds with the pattern portion 257A (and corresponding pattern portion 255A).

In the depicted embodiment, the patterned top layer 280 is used as a mask to form the second portion of the IC pattern in the material layer 220. For example, an etching process is applied to the integrated circuit device 200 using the patterned top layer 280 as an etch mask. The pattern defined in the patterned top layer (in other words, the second portion of the IC pattern) is transferred to the material layer 220 by the etching process. More particularly, the material layer 220 of the device substrate 210 is etched through the opening (pattern portion) 285A of the patterned top layer 280. In the depicted embodiment, the etching process removes portions of the middle layer 270, bottom layer 260, and material layer 220 within the opening, thereby forming the IC feature 290. The etching process may be a dry etching process, a wet etching process, or combination thereof. The material disposed underneath the material layer 220 may selected, and/or the etching recipe of the etching process may be tuned, such that the etching process stops at the device substrate 210. Thereafter, the patterned top layer 280 (and middle layer 270 and bottom layer 260) are removed by a suitable process, such as a wet stripping process or plasma ashing process, as illustrated in FIG. 7.

The IC features 290 and 295 are trenches (openings or recesses) in the material layer 220. Further, the IC features 290 and 295 are elliptically-shaped in the depicted embodiment. Alternatively, the IC features 290 and 295 are otherwise shaped, such as rectangular shaped, triangularly shaped, spherically-shaped, or other suitable shape. The IC features 290 and 295 have different dimensions. More specifically, the IC feature 290 is longer than the IC feature 290. The IC feature 295 has a substantially same width and length as pattern portion 257A (and corresponding pattern portion 255A), and thus IC feature 295 has a length, L, and a width, W. The IC feature 290 has a length, $L_4$, and a width, $W_4$. The length, $L_4$, of the IC feature 190 is larger than each of the lengths of the pattern portions 255A, 255B, 255C, and 285A in the first and second radiation-sensitive top layers 250 and 280 (and corresponding pattern portions 257A, 257B, 257C, and 287A) (thus, $L_4 > L_1$, where $L_1 \approx L_2 \approx L_3$, and $L_4 > L$). In the depicted embodiment, the width, $W_4$, is substantially the same width as pattern portions 255A, 255B, 255C, and 285A in the first and second radiation-sensitive top layers 250 and 280 (and corresponding pattern portions 257A, 257B, 257C, and 287A) (thus, $W_4 \approx W_1 \approx W_2 \approx W_3$).

Figure 8:
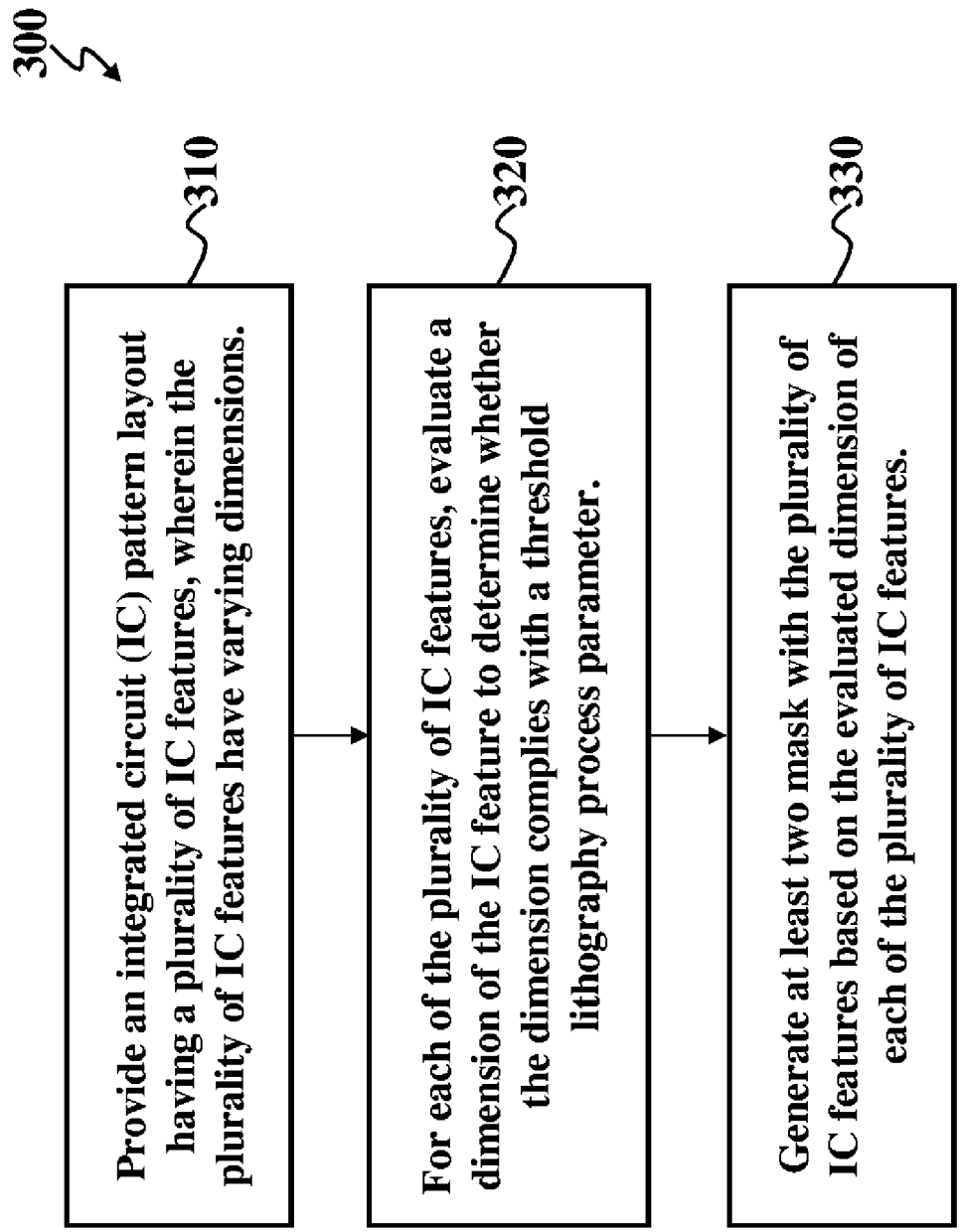
FIG. 8 is a flowchart of a method for forming masks for patterning a device substrate, such that the device substrate includes IC features of varying dimensions, according to various aspects of the present disclosure.

FIG. 8 is a flowchart of a method 300 for forming masks for patterning a device substrate, such that the device substrate includes IC features of varying dimensions, according to various aspects of the present disclosure. The method 300 begins at block 310 by providing an IC pattern layout having a plurality of IC features, wherein the plurality of IC features have varying dimensions. For example, the IC pattern layout may include a pattern of a plurality of trenches having varying dimensions, such as varying lengths. At block 320, the method 100 includes, for each of the plurality of features, evaluating a dimension of the IC feature to determine whether the dimension complies with a threshold lithography process parameter. In an example, if the dimension does not comply with the threshold lithography process parameter, the IC feature is separated into at least two feature portions that comply with the threshold lithography process parameter. Each of the at least two feature portions may be assigned to one of at least two masks. Further, if the dimension complies with the threshold lithography process parameter, the IC feature may be assigned to one of the at least two masks. At block 330, at least two masks are generated with the plurality of IC features based on the evaluated dimension of each of the plurality of IC features. Additional steps can be provided before, during, and after the method 300, and some of the steps described can be replaced or eliminated for other embodiments of the method. The discussion that follows illustrates various embodiments of a device substrate that can be fabricated according to the method 300 of FIG. 8.

Figure 9:
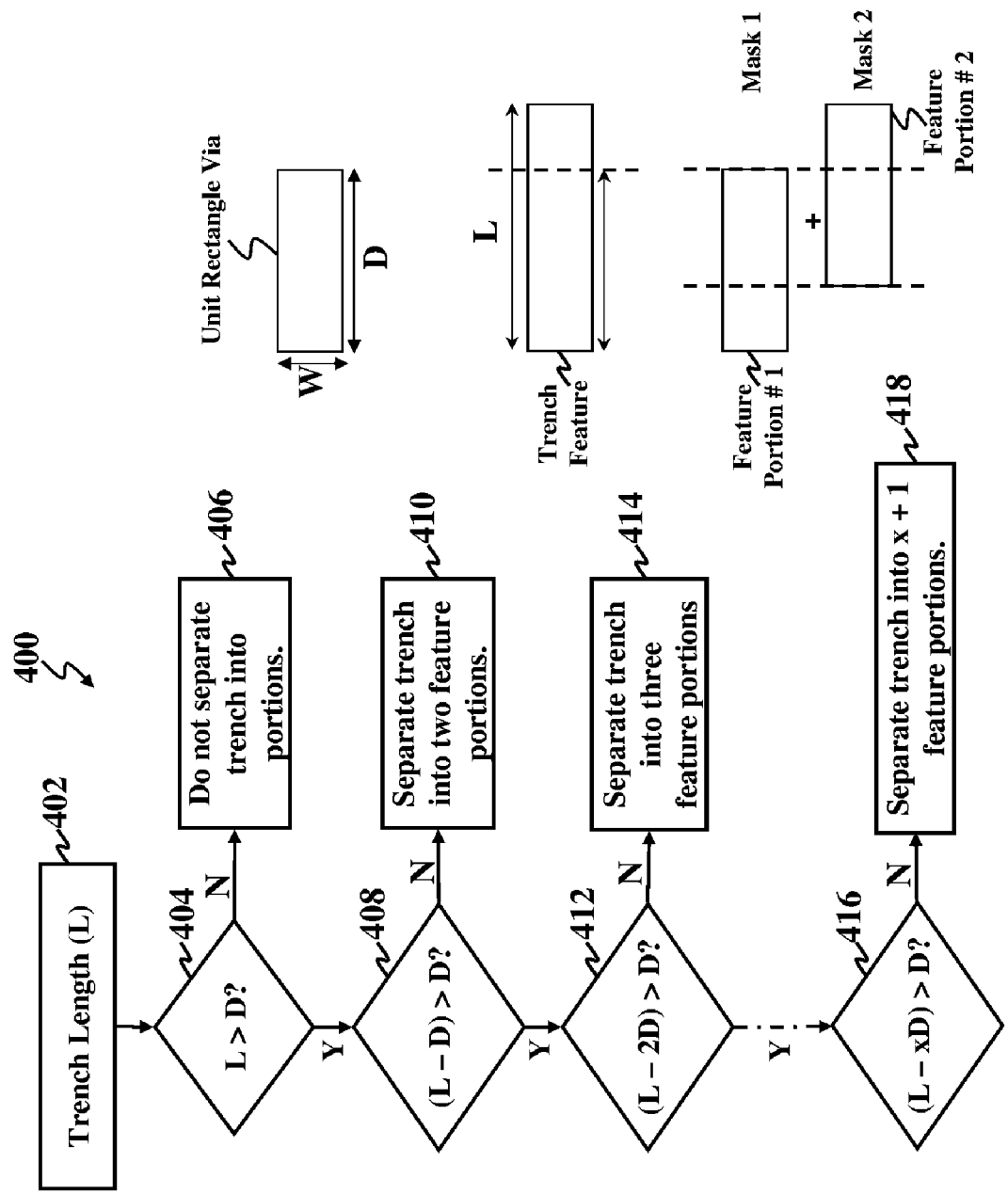
FIG. 9 is a flowchart of a method for evaluating a dimension of an IC feature according to various aspects of the present disclosure.

FIG. 9 is a flowchart of a method 400 for evaluating a dimension of an IC feature to determine whether the dimension complies with a threshold lithography process parameter, and for separating the IC feature into at least two feature portions that have dimensions complying with the threshold lithography process parameter if the dimension of the IC feature does not comply with the threshold lithography process parameter. The method 400 may be implemented in the method 300 of FIG. 8, for example, at block 320 of method 300. In the depicted embodiment, a length of an IC feature, more specifically, a length (L) of a trench is evaluated to determine whether the trench length complies (or satisfies) a threshold lithography process parameter, such as a threshold length (D). The threshold length is a minimum printable length for lithography processing. The threshold length may correspond with a lithography window, such as a minimum or maximum printable length/width (L/W) ratio, defined as a minimum L/W ratio printable to a radiation-sensitive layer during a lithography patterning process, which transfers the IC pattern from the mask to the semiconductor wafers.

At block 402, the trench length (L) is provided. At block 404, the trench length is compared to the threshold length to determine whether the trench length is greater than the threshold length (in other words, whether L>D). At block 406, if L is not greater than D, then the trench feature is not separated into multiple portions, and the trench feature will be patterned on a single mask. If L is greater than D, then the method 400 proceeds to block 408, where it is determined whether L−D is greater than D (L−D>D). At block 410, if L−D is not greater than D, then the trench feature is separated into two feature portions. For example, a trench feature is illustrated in FIG. 9 that has dimensions where L>D, yet L−D is not greater than D. The trench feature is thus separated into two contiguous feature portions (Feature Portion #1 and Feature Portion #2). Each feature portion has substantially the same dimension. For example, each feature portion has a length equivalent to the threshold length (D). In the depicted embodiment, each feature portion is equivalent to a unit rectangle via having the width, W, and length, D. Further, Feature Portion #1 partially overlaps Feature Portion #2. As will be described in further detail with reference to FIG. 10, the Feature Portion #1 is formed on a Mask 1 and Feature Portion #2 is formed on a Mask 2. At block 412, if L−D is not greater than D, then the method proceeds to block 412, where it is determined whether L−2D is greater than D (L−2D>D). At block 414, if L−2D is not greater than D, then the trench feature is separated into three feature portions. For example, the trench feature is separated into three contiguous feature portions, where each feature portion has substantially the same dimension, such as a length equivalent to D, and each feature portion partially overlaps at least one other feature portion. At block 412, if L−2D is greater than D, then the method proceeds to block 414, where it is determined whether L−xD is greater than D (L−xD>D). At block 416, if L−xD is not greater than D, the method proceeds to block 418, where the trench feature is separated into x+1 feature portions. For example, the trench feature is separated into x+1 contiguous feature portions, where each feature portion has substantially the same dimension, such as a length equivalent to D, and each feature portion partially overlaps at least one other feature portion. Thus, the method 400 essentially evaluates L−xD, where x=1, 2, 3, . . . n, until L−xD is less than D. L−xD is less than D when x=$x_{max}$, and thus, the trench feature is separated into $x_{max}$+1 contiguous feature portions. Additional steps can be provided before, during, and after the method 400, and some of the steps described can be replaced or eliminated for other embodiments of the method. The discussion that follows illustrates various embodiments of a device substrate that can be fabricated according to the method 400 of FIG. 9.

Figure 10:
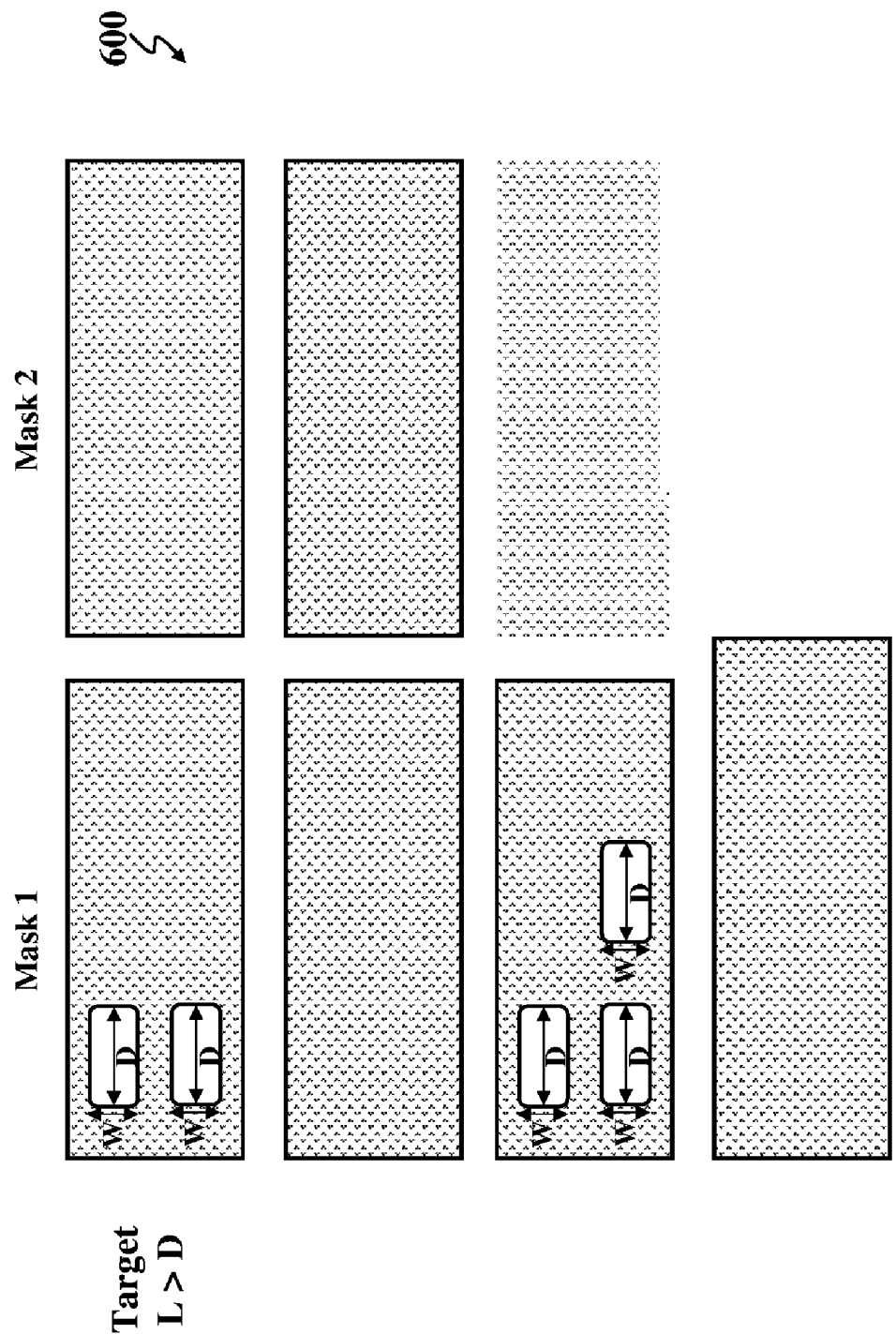
FIG. 10 illustrates various masks that can be fabricated with various IC patterns according to the methods of FIGS. 8 and 9 according to various aspects of the present disclosure.

FIG. 10 illustrates various masks that can be fabricated with various IC patterns according to the methods 300 and 400 of FIGS. 8 and 9, respectively, according to various aspects of the present disclosure. In FIG. 10, an IC pattern 600 includes features 602 and 604. Feature 602 has a length less than or equal to D ($L_{602} \leq D$). Evaluating feature 602 with method 300, the length of feature 602 is not greater than D, and thus, the method 300 proceeds to block 406 where the features 602 is not separated and is patterned on a single mask, Mask 1. In contrast, feature 604 has a length greater than D ($L_{604}$>D). Evaluating feature 604 with method 300, the $L_{604}$>D, however, $L_{604}$−D is not greater than D. Accordingly, the method 300 proceeds to 410 where the feature 604 is separated into two contiguous feature portions 604A and 604B. The feature portions 604A and 604B are unit rectangular vias, which have a width, W, and the threshold length, D. The feature portions 604A and 604B are assigned to the Masks 1 and 2, such that no two adjacent feature portions 604A and 604B are on the same mask. Further, the feature portions 604A and 604B are configured on the Masks 1 and 2, such that if the Mask 1 and Mask 2 are aligned on top of one another, the feature portions 604A and 604B are collinearly aligned and feature portions 604A and 604B partially overlap one another. The Masks 1 and 2 may be used to pattern a device substrate, such that a trench corresponding with feature 602 is formed and a trench corresponding with feature 604 is formed. The feature 604 is formed by the combined feature portions 604A and 604B.

An IC pattern 700 includes features 702 and 704. Feature 702 has a length less than or equal to D ($L_{702} \leq D$). Evaluating feature 702 with method 300, the length of feature 702 is not greater than D, and thus, the method 300 proceeds to block 406 where the feature 702 is not separated and is patterned on a single mask, Mask 1. In contrast, feature 704 has a length greater than D ($L_{704}$>D). Evaluating feature 704 with method 300, the $L_{704}$>2D, however, $L_{704}$−3D is not greater than D. Accordingly, the method 300 proceeds to 414 where the feature 704 is separated into three contiguous feature portions 704A, 704B, and 704C. The feature portions 704A, 704B, and 704C are unit rectangular vias, which have a width, W, and the threshold length, D. The feature portions 704A, 704B, and 704C are assigned to the Masks 1 and 2, such that no two adjacent feature portions 704A, 704B, and 704C are on the same mask. Further, the feature portions 704A, 704B, and 704C are configured on the Masks 1 and 2, such that if the Mask 1 and Mask 2 are aligned on top of one another, the feature portions 704A, 704B, and 704C are collinearly aligned and each of feature portions 704A, 704B, and 704C partially overlap at least one other feature portion 704A, 704B, and 704C. The Masks 1 and 2 may be used to pattern a device substrate, such that a trench corresponding with feature 702 is formed and a trench corresponding with feature 704 is formed. The feature 704 is formed by the combined feature portions 704A, 704B, and 704C.

An IC pattern 800 includes features 802 and 804. Feature 802 has a length less than or equal to D ($L_{802} \leq D$). Evaluating feature 802 with method 300, the length of feature 802 is not greater than D, and thus, the method 300 proceeds to block 406 where the feature 802 is not separated and is patterned on a single mask, Mask 1. In contrast, feature 804 has a length greater than D ($L_{804} > D$), and thus, $L_{804}-xD$ is evaluated until $L_{804}-xD$ is less than D, where x=1, 2, 3, ... n. As noted above, $L_{804}-xD$ is less than D when $x=x_{max}$. In the depicted embodiment, $L_{804}-xD$ is less than D when $x=x_{max}=3$. Accordingly, the method 300 proceeds to 418 where the feature 804 is separated into $x_{max}+1$ (here, four (4)) contiguous feature portions 804A, 804B, 804C, and 804D. The feature portions 804A, 804B, 804C, and 804D are unit rectangular vias, which have a width, W, and the threshold length, D. The feature portions 804A, 804B, 804C, and 804D are assigned to the Masks 1 and 2, such that no two adjacent feature portions 804A, 804B, 804C, and 804D are on the same mask. Further, the feature portions 804A, 804B, 804C, and 804D are configured on the Masks 1 and 2, such that if the Mask 1 and Mask 2 are aligned on top of one another, the feature portions 804A, 804B, 804C, and 804D are collinearly aligned and each of feature portions 804A, 804B, 804C, and 804D partially overlap at least one other feature portion 804A, 804B, 804C, and 804D. The Masks 1 and 2 may be used to pattern a device substrate, such that a trench corresponding with feature 802 is formed and a trench corresponding with feature 804 is formed. The feature 804 is formed by the combined feature portions 804A, 804B, 804C, and 804D.

An IC pattern 900 includes features 902 and 904. Feature 902 has a length less than or equal to D ($L_{902} \leq D$). Evaluating feature 902 with method 300, the length of feature 902 is not greater than D, and thus, the method 300 proceeds to block 406 where the feature 902 is not separated and is patterned on a single mask, Mask 1. In contrast, feature 904 has a length greater than D ($L_{904} > D$), and thus, $L_{904}-xD$ is evaluated until $L_{904}-xD$ is less than D, where x=1, 2, 3, ... n. As noted above, $L_{904}-xD$ is less than D when $x=x_{max}$. In the depicted embodiment, $L_{904}-xD$ is less than D when $x=x_{max}=4$. Accordingly, the method 300 proceeds to 419 where the feature 904 is separated into $x_{max}+1$ (here, five (5)) contiguous feature portions 904A, 904B, 904C, 904D, and 904E. The feature portions 904A, 904B, 904C, 904D, and 904E are unit rectangular vias, which have a width, W, and the threshold length, D. The feature portions 904A, 904B, 904C, 904D, and 904E are assigned to the Masks 1 and 2, such that no two adjacent feature portions 904A, 904B, 904C, 904D, and 904E are on the same mask. Further, the feature portions 904A, 904B, 904C, 904D, and 904E are configured on the Masks 1 and 2, such that if the Mask 1 and Mask 2 are aligned on top of one another, the feature portions 904A, 904B, 904C, 904D, and 904E are collinearly aligned and each of feature portions 904A, 904B, 904C, 904D, and 904E partially overlap at least one other feature portion 904A, 904B, 904C, 904D, and 904E. The Masks 1 and 2 may be used to pattern a device substrate, such that a trench corresponding with feature 902 is formed and a trench corresponding with feature 904 is formed. The feature 904 is formed by the combined feature portions 9904A, 904B, 904C, 904D, and 904E.

The present embodiments can take the form of an entirely hardware embodiment, an entirely software embodiment, or an embodiment containing both hardware and software elements. Furthermore, embodiments of the present disclosure can take the form of a computer program product accessible from a tangible computer-usable or computer-readable medium providing program code for use by or in connection with a computer or any instruction execution system. For the purposes of this description, a tangible computer-usable or computer-readable medium can be any apparatus that can contain, store, communicate, propagate, or transport the program for use by or in connection with the instruction execution system, apparatus, or device. The medium can be an electronic, magnetic, optical, electromagnetic, infrared, a semiconductor system (or apparatus or device), or a propagation medium.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
providing an integrated circuit (IC) pattern layout having a plurality of IC features, wherein the plurality of IC features have varying dimensions;
for each of the plurality of IC features, evaluating a dimension of the IC feature to determine whether the dimension complies with a threshold lithography process parameter corresponding to a limit of printability to a radiation-sensitive layer during a lithography patterning process, wherein:
if the dimension does not comply with the threshold lithography process parameter, separating the IC feature into at least two feature portions that comply with the threshold lithography process parameter, and
assigning each of the at least two feature portions of the IC feature to one of at least two masks; and
generating at least two masks with the plurality of IC features based on the evaluated dimension of each of the plurality of IC features.

2. The method of claim 1 wherein:
the threshold lithography processing parameter is a threshold length (D); and
the evaluating the dimension of the IC feature to determine whether the dimension complies with the threshold lithography process parameter includes determining a length (L) of the IC feature, wherein the dimension does not comply with the threshold lithography process parameter if L>D.

3. The method of claim 2 wherein the separating the IC feature into at least two feature portions that comply with the threshold lithography process parameter includes separating the IC feature into at least two feature portions having a dimension equal to the threshold length (D).

4. The method of claim 3 wherein the assigning each of the at least two feature portions of the IC feature to one of at least two masks includes configuring the at least two feature portions on the at least two masks such that, if the at least two masks are aligned on top of one another, the at least two feature portions are collinearly aligned and the at least two feature portions partially overlap one another.

5. The method of claim 2 wherein the separating the IC feature into at least two feature portions that comply with the threshold lithography process parameter includes:
determining when L−xD is less than D, where x=1, 2, 3, ... n, such that L−xD is less than D when $x=x_{max}$; and separating the IC feature into $x_{max}+1$ contiguous feature portions.

6. The method of claim 5 wherein the assigning each of the at least two feature portions of the IC feature to one of at least two masks includes:
  assigning the $x_{max}+1$ feature portions to a first mask and a second mask, wherein every other $x_{max}+1$ feature portion is assigned to one of the first mask and a second mask, such that no two adjacent $x_{max}+1$ feature portions are assigned to the same mask; and
  configuring the $x_{max}+1$ feature portions on the first and second masks such that, if the first and second masks are aligned one on top of another, the $x_{max}+1$ feature portions are collinearly aligned and each of the $x_{max}+1$ feature portions partially overlaps another $x_{max}+1$ feature portion.

7. The method of claim 6 wherein the evaluating the dimension of the IC feature to determine whether the dimension complies with the threshold lithography process parameter further includes assigning the IC feature to one of the first mask and the second mask if the dimension complies with the threshold lithography process parameter.

8. The method of claim 1 further including patterning a device substrate using the at least two masks with the plurality of IC features, such that the device substrate includes the plurality of IC features.

9. The method of claim 8 wherein the patterning the device substrate such that it includes the plurality of IC features includes forming trenches having varying lengths in the device substrate.

10. A method comprising:
  providing an integrated circuit (IC) pattern layout that includes a first IC feature having a first dimension and a second IC feature having a second dimension different than the first dimension,
    wherein the first dimension satisfies a threshold processing parameter, the threshold processing parameter corresponding to a limit of printability to a radiation-sensitive layer during a lithography patterning process, and
    wherein the second dimension does not satisfy the threshold processing parameter;
  separating the second IC feature into contiguous multiple pattern portions, wherein each of the multiple pattern portions has a dimension that satisfies the threshold processing parameter;
  forming a first mask having a first pattern including the first IC feature and a first group of the multiple pattern portions of the second IC feature, the multiple pattern portions of the first group being collinearly aligned and configured such that each pattern portion in the first group is a distance from an adjacent pattern portion;
  forming a second mask having a second pattern that includes a second group of the multiple pattern portions of the second IC feature, the multiple pattern portions of the second group being collinearly aligned and configured such that each pattern portion in the second group is a distance from an adjacent pattern portion; and
  further wherein the first and second groups are configured on the first and second masks such that, when the first and second masks are aligned on top of one another, the first and second groups of the multiple pattern portions are collinearly aligned and each of the multiple pattern portions of the first group partially overlaps at least one of the multiple pattern portions of the second group.

11. The method of claim 10 further including using the first and second masks to pattern a device substrate.

12. The method of claim 11 wherein the using the first and second masks to pattern the device substrate includes forming the first and second IC features in the device substrate.

13. The method of claim 12 wherein the forming the first and second IC features in the device substrate includes forming a first trench and a second trench in the device substrate, wherein the first trench has the first dimension and the second trench has the second dimension.

14. The method of claim 11 wherein the using the first and second masks to pattern the device substrate includes performing a double patterning double etching process.

15. A method comprising:
  forming a first patterned radiation-sensitive resist layer over a device substrate using a first mask, wherein the first patterned radiation-sensitive resist layer includes a first portion of an integrated circuit (IC) pattern;
  using the patterned first radiation-sensitive resist layer as a mask to form the first portion of the IC pattern in the device substrate;
  forming a second patterned radiation-sensitive resist layer over the device substrate using a second mask, wherein the second patterned radiation-sensitive resist layer includes a second portion of the IC pattern; and
  using the patterned second radiation-sensitive resist layer as a mask to form the second portion of the IC pattern in the device substrate,
    wherein the combined first and second portions of the IC pattern in the device substrate form an IC feature having a dimension greater than dimensions of the first and second portions,
    and wherein the IC feature has a dimension exceeding a limit of printability to the first and second radiation-sensitive resist layers during a lithography patterning process.

16. The method of claim 15 wherein the using the patterned first radiation-sensitive resist layer as the mask to form the first portion of the IC pattern in the device substrate and the using the patterned second radiation-sensitive layer as the mask to form the second portion of the IC pattern in the device substrate includes etching the device substrate to form a plurality of trenches that merge together to form the IC feature, wherein the IC feature is a trench having a dimension greater than each of the plurality of trenches.

17. The method of claim 15 wherein:
  the forming the first patterned radiation-sensitive resist layer over the device substrate using the first mask includes using a mask having a first pattern including a first group of multiple pattern portions, the multiple pattern portions of the first group being collinearly aligned and configured such that each pattern portion in the first group is a distance from an adjacent pattern portion;
  the forming the second patterned radiation-sensitive resist layer over the device substrate using the second mask includes using a mask having a second pattern that includes a second group of multiple pattern portions, the multiple pattern portions of the second group being collinearly aligned and configured such that each pattern portion in the second group is a distance from an adjacent pattern portion; and
  wherein the first and second groups are configured on the masks such that, when the masks are aligned on top of one another, the first and second groups of the multiple pattern portions are collinearly aligned and each of the multiple pattern portions of the first group partially overlaps at least one of the multiple pattern portions of the second group.

18. The method of claim 17 wherein:
each of the multiple pattern portions has a same dimension, the same dimension being a threshold length; and
the forming the IC feature having a dimension greater than dimensions of the first and second portions includes forming the IC feature to have a length greater than the threshold length.

19. The method of claim 15 wherein the using the patterned first radiation-sensitive resist layer as the mask to form the first portion of the IC pattern in the device substrate includes etching a first trench having a first length in the device substrate.

20. The method of claim 19 wherein the using the patterned second radiation-sensitive resist layer as the mask to form the second portion of the IC pattern in the device substrate includes etching a second trench having a second length in the device substrate adjacent to the first trench, such that the second trench merges with the first trench, thereby forming the IC feature, wherein the IC feature is a third trench having a third length that is larger than both the first length and the second length.

* * * * *